United States Patent

[11] 3,588,742

[72] Inventors John A. Copeland, III
Gillette; Robert R. Spiwak, Piscataway, both of N.J.

[21] Appl. No. 821,637
[22] Filed May 5, 1969
[45] Patented June 28, 1971

[73] Assignee Bell Telephone Laboratories, Incorporated
Murray Hill, N.J.

[54] LSA OSCILLATOR WITH FIRST, SECOND AND THIRD HARMONIC CIRCUITS FOR INCREASED EFFICIENCY
20 Claims, 8 Drawing Figs.

[52] U.S. Cl. ........ 331/96, 331/107
[51] Int. Cl. ........ H03b 7/06, H03b 7/14
[50] Field of Search ........ 331/96, 97, 107, 107 (G), 107 (T)

[56] References Cited
UNITED STATES PATENTS

| | | | |
|---|---|---|---|
| 3,435,374 | 3/1969 | Whitten | 331/175X |
| 3,471,806 | 10/1969 | Whitehorn | 331/96X |
| 3,510,800 | 5/1970 | Kaneko et al. | 331/107(G)X |

*Primary Examiner*—Roy Lake
*Assistant Examiner*—Siegfried H. Grimm
*Attorneys*—R. J. Guenther and Arthur J. Torsigliere

ABSTRACT: The efficiency of an LSA oscillator is increased by adding a second harmonic component to the voltage across the diode and a third harmonic component to the diode current, preferably by adding an external parallel resonant circuit resonant at the second harmonic frequency and a series resonant circuit resonant at the third harmonic frequency. In one microwave circuit implementation, the LSA diode is mounted in an appropriately designed waveguide iris.

INVENTORS J.A. COPELAND III
R.R. SPIWAK
BY
Robert B. Anderson
ATTORNEY

LSA OSCILLATOR WITH FIRST, SECOND AND THIRD HARMONIC CIRCUITS FOR INCREASED EFFICIENCY

BACKGROUND OF THE INVENTION

This invention relates to bulk-effect devices, and more particularly, to limited space-charge accumulation (LSA) devices that may be used as microwave sources.

The patent of J. B. Gunn, 3,365,583, describes a family of bulk-effect devices, each comprising a wafer of appropriate semiconductor material such as gallium arsenide, in which traveling domain oscillations can be excited through the application of a bias voltage above a prescribed threshold value. These traveling domains result from a known mechanism of electron transfer between conduction band valleys which establishes a negative differential resistance to internal currents in the wafer, and are manifested by oscillatory currents in the output terminals, now generally known as Gunn-effect oscillations.

The copending application of J. A. Copeland III, Ser. No. 564,081, filed July 11, 1966, and assigned to Bell Telephone Laboratories, Incorporated, and the paper by J. A. Copeland III, "LSA Oscillator-Diode Theory," Journal of Applied Physics, Vol. 38, No. 8, July 1967, pages 3096—3101, describe how a mode of oscillation called the LSA mode (for *l*imited *s*pace-charge *a*ccumulation), can be induced in bulk-effect diodes of the general type described in the Gunn patent. This new mode of oscillation is not dependent on the formation of traveling domains, its frequency is not dependent on wafer length, and as a result, the oscillator does not have the frequency and power limitations of the Gunn oscillator. The LSA mode oscillator includes a bulk semiconductor diode, a resonant circuit and a load, the various parameters of which are adjusted such that the electric field intensity within the diode alternates between a high value at which negative resistance occurs, and a lower value at which the diode displays a positive resistance. By appropriately adjusting the duration of electric field excursions into the positive and negative resistance regions of the diode, one can prevent the formation of traveling domains responsible for Gunn-effect oscillation, while still obtaining the negative resistance required for sustained oscillations.

SUMMARY OF THE INVENTION

We have found that LSA oscillator efficiency can be substantially increased by adding an external parallel resonant circuit resonant at the second harmonic frequency and a series resonant circuit resonant at the third harmonic frequency. The parallel resistance $R_2$ at the second harmonic frequency is relatively large and the series resistance $R_3$ at the third harmonic frequency is relatively small. The effect of these harmonic resonances is to add a substantial second harmonic component to the voltage across the diode and a substantial third harmonic component to the current through the diode. As will be explained more fully later, the addition of these harmonic components increases efficiency at the fundamental or first harmonic frequency at which output power is utilized, by, in effect, increasing the fundamental frequency current that can be permitted through the diode consistent with LSA operation.

In accordance with one embodiment of the invention, the external resonances are all provided by symmetrically mounting the diode in a waveguide iris. The iris has a thickness, in the direction of waveguide propagation, of $\lambda/6$, where $\lambda$ is the wavelength of the fundamental frequency. This thickness dimension provides the required resonance at the third harmonic with an appropriately small series resistance. The length dimension of the iris is divided into four sections, each having a length $\lambda/6$. The two end sections adjacent opposite vertical walls each have a characteristic impedance Z/3 and those adjacent the diode have a characteristic impedance Z. The abrupt changes in impedance may be provided, for example, by abruptly changing the height of the iris. This structure provides oscillatory modes in the iris at the fundamental and a second harmonic frequencies, with an appropriately high parallel resistance $R_2$ at the second harmonic, as will be described later.

These and other objects, features, and advantages of the invention will be better understood from a consideration of the following detailed description taken in conjunction with the accompanying drawing.

DRAWING DESCRIPTION

DETAILED DESCRIPTION

Figure 1:
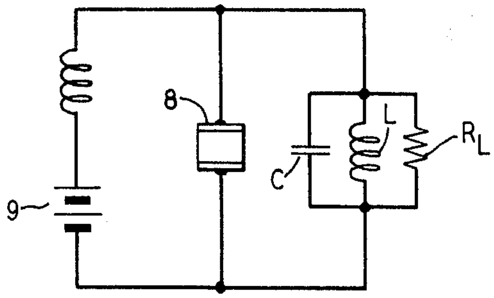
FIG. 1 PRIOR ART
FIG. 1 is a schematic diagram of an LSA oscillator circuit of the prior art.

Referring now to FIG. 1, there is shown a schematic diagram of an LSA oscillator circuit of the prior art comprising a bulk-effect diode 8 biased by a voltage source 9. The diode comprises a wafer of bulk-effect semiconductor material, such as N-type gallium arsenide, contained between opposite ohmic contacts. Coupled to the diode is a parallel resonant circuit comprising a capacitance C, an inductance L and a load resistance $R_L$. The purpose of LSA operation is to take advantage of the negative resistance of bulk-effect diodes to generate high frequency oscillations across the load resistance $R_L$ without permitting traveling domains to form within the diode wafer as is characteristic of Gunn-effect operation, thus realizing substantial advantages in terms of attainable frequency and power.

Figure 2:
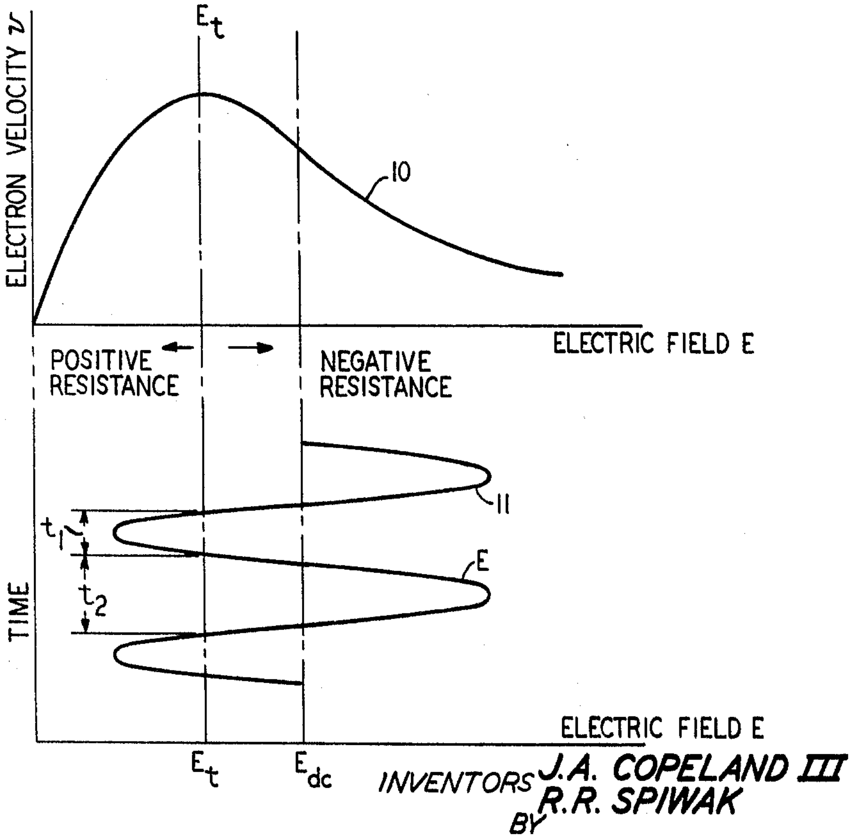
FIG. 2 illustrates graphs of electron velocity versus electron field and time versus electric field in the diode of the circuit of FIG. 1.

One requirement of LSA operation is that the diode specimen be of substantially uniform constituency and be doped in a known manner to give a negative resistance characteristic as shown by curve 10 of FIG. 2. For purposes of this application, the term bulk-effect device shall mean any semiconductor device having a carrier velocity versus electric field characteristic of the general type shown by curve 10. For N-type materials, the carrier velocity refers to electron velocity and for P-type materials it refers to hole velocity. At applied bias fields in excess of its threshold voltage $E_t$, the specimen displays a negative resistance, while at fields lower than $E_t$, it displays a positive resistance. If a steady DC voltage in excess of $E_t$ were applied to the specimen, traveling domain oscillations would be excited as is described generally in the Gunn patent.

While the direct-current electric field $E_{dc}$ applied to the specimen by DC source 9 exceeds the threshold voltage $E_t$, the external tank circuit and load resistance $R_L$ causes the actual electric field E in the specimen to oscillate as is shown by curve 11 of FIG. 2. During the time interval $t_1$ of each cycle of E, the electric field in the diode extends below the threshold voltage $E_t$ into the positive resistance region of the diode, while during the remaining portion of the cycle $t_2$, it extends into the negative resistance region above $E_t$. The frequency of E is determined by the oscillator resonant circuit, while the amplitude is a function of the load resistance $R_L$ of the circuit.

During the negative resistance period, RF energy grows exponentially as it propagates through the diode, which more than compensates for its attenuation during the positive resistance portion, thus giving a net gain. As has been described previously in the literature, the gain of the device will exceed its attenuation if the following relation is satisfied:

$$\frac{1}{t_1+t_2}\int^{(t_1+t_2)} Evdt < E_{dc}v_a \qquad (1)$$

where the integral is taken over one cycle, E is the electric field, $v$ is the carrier velocity, $v_a$ is the average carrier drift velocity in the wafer during oscillation, $t_1$ is the time interval during each cycle in which the diode is in a positive resistance condition, $t_2$ is the time interval during each cycle in which the diode is in a negative resistance condition and $E_{dc}$ is the direct current bias electric field. Traveling domains in the wafer are prevented by making the time interval $t_2$ small enough so that space-charge accumulation cannot occur in that time interval, and by making $t_1$ long enough to attenuate space-charge accumulation to prevent it from growing with succeeding cycles. To meet these requirements, the following relationships should also be satisfied:

$$\frac{ne}{\epsilon}\int^{(t_2)} |\mu| dt < 10 \qquad (2)$$

$$\frac{ne}{\epsilon}\int^{(t_1)} |\mu| dt > \frac{ne}{\epsilon}\int^{(t_2)} |\mu| dt \qquad (3)$$

where $\int^{(t_2)}$ is the integral taken over the time period $t_2$, $\epsilon$ is the permittivity of the wafer, $n$ is the wafer carrier concentration $\mu$ is the differential mobility of the wafer, $e$ is the charge on a majority carrier and $\int^{(t_1)}$ is the integral taken over the time period $t_1$.

The prior art further teaches that in order to give the oscillating field E sufficient amplitude to extend into the positive resistance region and to rise sharply into the negative resistance region, the load resistance should be sufficiently high. In the circuit of FIG. 1, load resistance $R_L$ should conform to the relationship $$R_L > \frac{l}{n_o|\mu_2|eA} \qquad (4)$$

where $l$ is the length of the wafer between opposite contacts, $n_o$ is the doping level or average carrier concentration of the wafer, A is the area of the sample in the plane transverse to the drift current and $\mu_2$ is the average negative mobility in the negative resistance region which is given by $$|\mu_2| = \frac{1}{t_2}\int^{(t_2)} |\mu| dt \qquad (5)$$

With fulfillment of the above conditions, the oscillator of FIG. 1 operates in the LSA mode and gives the well-recognized advantages of LSA operation. The application of J. A. Copeland III, Ser. No. 612,598, filed Jan. 30, 1967, now U.S. Pat. 3,414,841, issued Dec. 3, 1968, and assigned to Bell Telephone Laboratories, Incorporated, points out that oscillations may be initiated either by transient effects or by applying a burst of RF energy.

Figure 3:
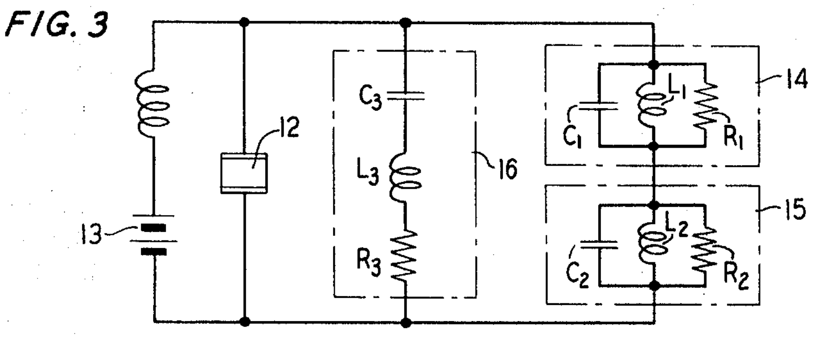
FIG. 3 is an equivalent circuit in accordance with an illustrative embodiment of the invention.

Referring now to FIG. 3, there is shown, for purposes of illustration, an equivalent LSA oscillator circuit in accordance with the invention comprising a bulk-effect diode 12 biased by a voltage source 13. Coupled to the diode are two parallel resonators 14 and 15 and a series resonator 16. Resonator 14 is resonant at the fundamental or LSA frequency $f$, while circuits 15 and 16 are respectively resonant at the second harmonic frequency $2f$ and the third harmonic frequency $3f$. The subscripts of the inductors, capacitors and resistors designate the first, second and third harmonic frequencies.

In the classic LSA oscillator of FIG. 1, only a single fundamental frequency external resonator is sued, and therefore, the RF voltage across the diode is sinusoidal as shown by curve 11. In effect, the present invention lies in the addition of resonators 15 and 16. The purpose of resonator 15 is to add a large second harmonic component to the voltage across diodes 12, while resonator 16 is used to add a large third harmonic component to current through the diode. Accordingly, $R_2$ is made as large as is convenient and $R_3$ is made small; or $$R_3 < R_1 < R_2 \qquad (6)$$

As will be seen later, $R_3$ may be infinitely small and $R_2$ infinitely large.

Figure 4:
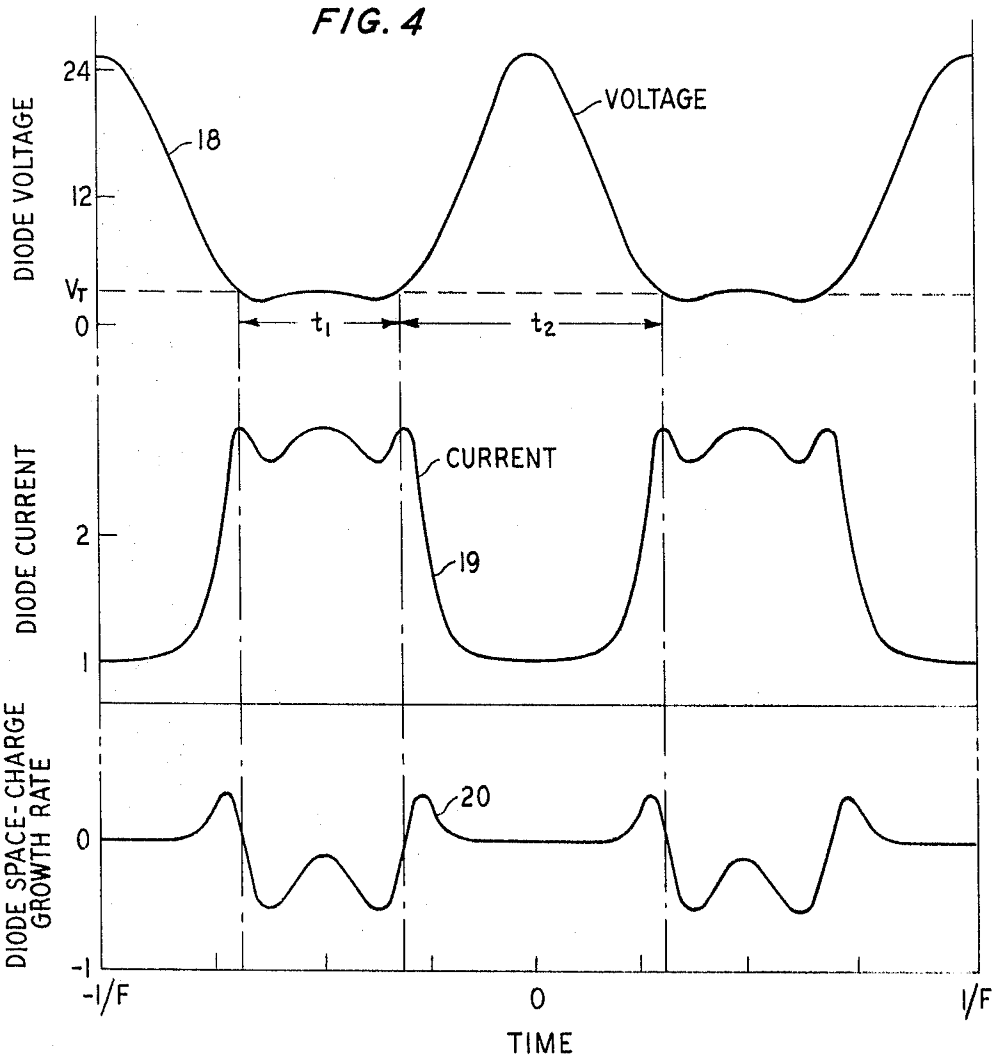
FIG. 4 is a graph of voltage and current waveforms through the bulk-effect diode of the circuit of FIG. 3.

The harmonic components add to the fundamental frequency to give the diode voltage characteristic shown by curve 18 of FIG. 4 and the diode current characteristic shown by curve 19. For high efficiency in accordance with the invention, curve 18 may typically be composed of DC fundamental, and second harmonic voltage components equal to 11.0, 11.2, and 4.0 kilovolts per centimeter, respectively. Little or not third harmonic voltage is developed across resonator 16 because of the small value of resistance $R_3$. This waveform gives higher operating efficiency than a sinusoidal or a single frequency waveform because, unlike a sinusoidal waveform, it does not have to drop far below the threshold voltage $V_T$ to give a time interval $t_1$ sufficiently high to satisfy equation (4).

The electric field curve 11 of FIG. 2 is of course modified by the second harmonic component to be identical to voltage curve 18 of FIG. 4. Rather than extending into a positive resistance region corresponding to a high slope of velocity-electric field curve 10, the electric field, during time $t_1$, remains in a region of high electron velocity $v$; thus, substantial reductions in diode current are avoided while still satisfying the conditions for LSA operation. The efficiency is also enhanced because the voltage of curve 18 passes more quickly through the voltage range just above threshold where space-charge growth is most rapid. Curve 20 shows on the same time scale the space-charge growth rate in the diode.

Curve 19 shows the current waveform resulting from the addition of the third harmonic current component to the fundamental frequency. Because of the high value of $R_2$, little or no second harmonic component is added to the current waveform.

To comply with known LSA conditions, the current must oscillate between maximum and minimum values, as is known in the art. It can further be shown that a square wave contains a higher amplitude fundamental component than any other waveform oscillating between corresponding maxima and minima. As can be seen from curve 19, the addition of a third harmonic contributes strongly to the approximation of a square waveform. Thus, the addition of the third harmonic component permits a larger fundamental current component to be used than would normally be permitted, which in turn enhances device efficiency.

To generate the waveforms 18 and 19, the harmonic frequencies must of course be added in proper phase with the fundamental. However, computer studies show that the circuit of FIG. 3 inherently establishes the desired phase relationships, at least when a gallium arsenide diode is used which is biased at any suitable voltage below about 12 kilovolts per centimeter. Above 12 kilovolts per centimeter bias voltage, the phase relationships change, thus reducing the efficiency advantages.

Figure 5:
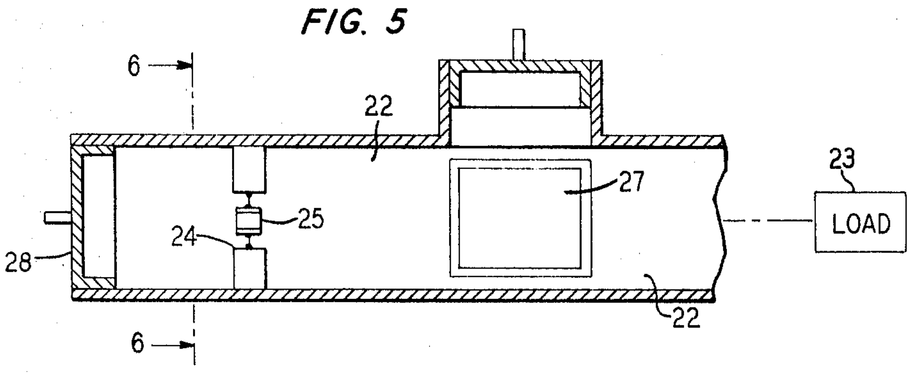
FIG. 5 is a schematic illustration of an LSA oscillator circuit in accordance with one embodiment of the invention.
Figure 6:
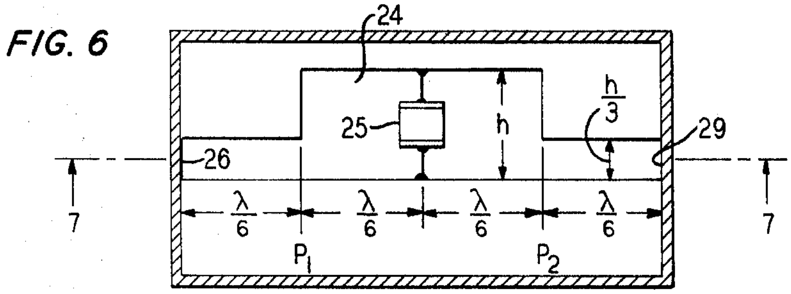
FIG. 6 is a view taken along lines 6—6 of FIG. 5.
Figure 7:
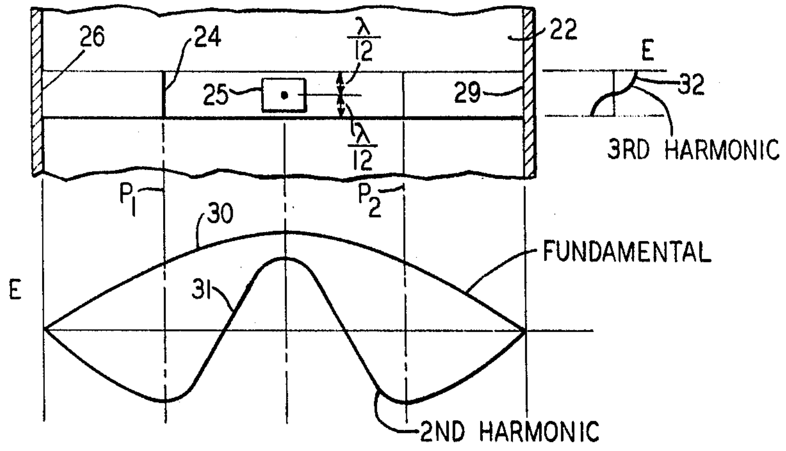
FIG. 7 is a view taken along lines 7—7 of FIG. 6, along with graphs of electric field distribution.

FIGS. 5, 6, and 7 illustrate a microwave frequency implementation of the oscillator circuit of FIG. 3 comprising a waveguide 22 for transmitting microwave energy to a load 23. The waveguide includes an iris 24 in which is symmetrically mounted a bulk-effect diode 25. An E-H tuner 27 in conjunction with a tuning plunger 28 is used to match impedances for proper transmission to the load at the fundamental LSA operating frequency. Referring to FIG. 6, the iris 24 has a height $h$ between the diode 25 and points $R_1$ and $P_2$, each $\lambda/6$ from the diode, where $\lambda$ is the wavelength of the fundamental frequency. The iris height from points $P_1$ and $P_2$ to the adjacent vertical iris walls 26 and 29 are each $h/3$. As shown in FIG. 7, the thickness of the iris is equal to $\lambda/6$.

It can be shown that the iris configuration described supports a fundamental oscillatory mode of frequency $f$ and wavelength $\lambda$, a second harmonic oscillatory mode at frequency $2f$, and a third harmonic oscillatory mode at frequency $3f$. The electric field distribution for the fundamental oscillatory mode is shown by curve 30 of FIG. 7, that for the second harmonic by curve 31, and that for the third harmonic by curve 32. The iris thickness of $\lambda/6$ is appropriate for establishing a third harmonic resonance in series with the diode. The iris length and the change of impedance at points P are appropriate for establishing the parallel resonances at the fundamental and second harmonic frequencies.

To provide parallel resonance at the fundamental and second harmonic and series resonance at the third harmonic, the following should obtain: The diode should be located at an electric field maximum of the fundamental mode and at an electric field maximum of all modes resonant at the second harmonic. Typically, more than one second harmonic mode will be created. The diode should be at a magnetic field maximum of a mode resonant at the third harmonic. The electric field distribution illustrations of FIG. 7 show that these criteria are met. To satisfy the resistance requirements of expression (6), the iris should be lightly loaded at all modes but the fundamental.

Figure 8:
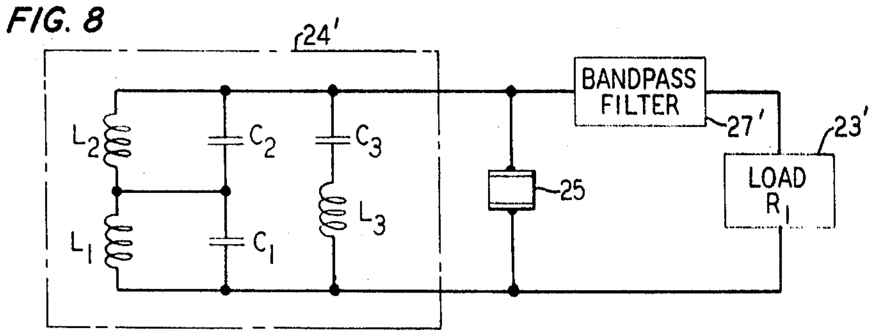
FIG. 8 is an equivalent circuit diagram of the circuit of FIGS. 5 and 6.

A more accurate equivalent circuit diagram is shown in FIG. 8 in which box 24′ indicates the various resonances within the iris 24 of FIG. 6. The E-H tuner 27 of FIG. 5 is functionally equivalent to the band-pass filter 27′ of FIG. 8 which passes only the fundamental frequency $f$ to load 23′. Load 23′ is in turn the equivalent of resistance $R_1$ of FIG. 3. The absence of a parallel resistance $R_2$ and a series resistance $R_3$ is equivalent of an infinitely high resistance $R_2$ of FIG. 3 and an infinitely low resistance $R_3$.

The stepping of iris height at points $P_1$ and $P_2$ of FIG. 6 is merely an example of one device for changing the transmission line impedance of the iris at those points, It can be shown that, to create the two oscillatory modes shown by curves 30 and 31, it is necessary only that the iris impedance between the diode and points $P_1$ and $P_2$ be three times the impedance between points $P_1$ and $P_2$ and the adjacent vertical iris walls 26 and 29. That is, the impedance between diode 25 and point $P_2$ should be Z and that between point $P_2$ and wall 29 should be Z/3.

If so desired, the iris of FIG. 4 may be replaced by an iris of constant physical height $h$, if other means are used for changing the iris impedance. For example, the impedance of the iris may be changed by filling the iris between $P_1$ and wall 26 and between $P_2$ and wall 29 with a material having a dielectric constant which is nine times the dielectric constant between points $P_1$ and $P_2$. Since characteristic transmission line impedance varies as the square root of the dielectric constant, the iris impedance between the diode and point $P_2$ would be Z, while the impedance between point $P_2$ and the vertical wall 29 would be Z/3. It is to be understood that the iris transmission line impedance is determined by considering the iris as a transmission line between the diode 25 and either of the vertical iris walls.

In summary, it has been shown that the efficiency of an LSA oscillator may be substantially improved by adding a second harmonic component to the diode voltage and a third harmonic component to the diode current. This is best accomplished by coupling to the diode a parallel resonant circuit resonant at the second harmonic frequency and to a series resonant circuit resonant at the third harmonic frequency. A microwave circuit has been described in which the LSA diode is symmetrically mounted in a waveguide iris. The thickness of the iris is equal to $\lambda/6$, thus giving rise to the third harmonic resonance, while the transmission line impedance of the iris is changed abruptly from Z to Z/3 between the diode and opposite vertical iris walls to give resonances at the fundamental and second harmonic frequencies.

Various other modifications and embodiments can be made by those skilled in the art without departing from the spirit and scope of the invention.

We claim:

1. In a circuit of the type comprising a bulk-effect semiconductor diode connected to a DC voltage source, a load resistance, and a parallel resonant circuit having a resonant frequency $f$, the parameters thereof being arranged to give oscillation in the device in the LSA mode at a frequency $f$, the improvement comprising:
a second parallel resonant circuit coupled to the diode;
the second resonant circuit being resonant at a frequency $2f$;
a third series resonant circuit coupled to the diode;
the second resonant circuit being resonant at a frequency $2f$.

2. The improvement of claim 1 wherein:
the second resonant circuit constitutes means for adding a significantly high second harmonic component to the voltage across the diode.

3. The improvement of claim 2 wherein:
the third resonant circuit constitutes means for adding a significantly high third harmonic component to the current through the diode.

4. The improvement of claim 3 wherein:
the second resonant circuit is constructed such as to add a negligible second harmonic component to current through the diode.

5. The improvement of claim 4 wherein:
the third resonant circuit is constructed such as to add a negligible third harmonic component to voltage across the diode.

6. The improvement of claim 1 wherein:
the diode is mounted in a waveguide iris, which defines the first, second, and third resonant circuits.

7. The improvement of claim 6 wherein:
the iris supports oscillatory modes at the fundamental frequency $f$, the second harmonic frequency $2f$, and the third harmonic frequency $3f$;
the diode is connected between opposite walls of the iris at a location corresponding to an electric field maximum of the fundamental frequency oscillatory mode, an electric field maximum of the second harmonic mode, and a magnetic field maximum of the third harmonic mode.

8. The improvement of claim 7 wherein:
the diode is connected to opposite horizontal iris walls and is substantially midway between opposite vertical iris walls;
the transmission line impedance of the iris changes at two locations P, each substantially halfway between the diode and one vertical iris wall;
the transmission line impedance of the iris between each point P and the diode is substantially three times the transmission line impedance of the iris between each point P and the adjacent vertical iris wall.

9. The improvement of claim 8 wherein:
the distance between the diode and each vertical iris wall is substantially one-third of a wavelength at frequency $f$;
and the distance between the diode and each point P is substantially one-sixth wavelength at the frequency $f$.

10. The improvement of claim 9 wherein:
the thickness of the iris is approximately one-sixth wavelength at the fundamental frequency $f$;
and the diode is symmetrically mounted within the iris.

11. The improvement of claim 10 wherein:
the height of the iris between locations P and the adjacent vertical iris walls is substantially one-third the height of the iris between the locations P and the diode.

12. A microwave oscillator comprising:
a wafer of semiconductor material exhibiting positive or negative differential resistance depending on the magnitude of the electric field therein;
means for applying to the wafer an electric field that alternates between values that cause the differential resistance of the wafer to be positive and values that cause the differential resistance to be negative, said electric field alternating in such a manner that space-charge does not accumulate and cause excessive distortion of the internal electric field;

said applying means comprising first, second, and third resonators coupled to the wafer and respectively resonant at a fundamental frequency $f$, a second harmonic frequency $2f$, and a third harmonic frequency $3f$.

13. The oscillator of claim 12 wherein:

said first, second, and third resonators respectively constitute means for presenting an external resistance $R_1$ to wafer current of frequency $f$, an external resistance $R_2$ to wafter current of frequency $f$, an external resistance $R_2$ to wafer current of frequency $2f$, and an external resistance $R_3$ to wafer current of frequency $3f$;

resistance $R_2$ being greater than $R_1$, and resistance $R_3$ being smaller than $R_1$.

14. The oscillator of claim 13 wherein:

resistance $R_1$ is substantially given by:

therefor $R_1 > \frac{l}{n_0|\mu_2|eA}$.

where $\mu$ is the length of the wafer, $n_0$ is the carrier concentration of the wafer, $\mu_2$ is the average negative mobility of the wafer, $e$ is the charge on he majority carrier, and A is the cross-sectional area of the wafer in a direction transverse to wafer current.

15. An LSA oscillator circuit comprising:

a bulk-effect diode;

means comprising a waveguide for propagating wave energy of frequency $f$ from the diode to a load;

an iris in the waveguide;

said diode being connected between opposite horizontal iris walls and being symmetrically located in the iris midway between the opposite vertical walls;

the transmission line impedance of the iris between a first vertical wall and a first point $P_1$ being $\frac{Z}{3}$, the transmission line impedance of the iris between the first point $P_1$ and the diode being substantially Z, the impedance of the iris between the diode and a second point $P_2$ being substantially Z, the impedance between the second point $P_2$ and a second vertical wall of the iris being substantially Z/3, whereby oscillatory modes at frequencies $f$ and $2f$ are established in the iris.

16. The oscillator circuit of claim 15 wherein:

the distances between the diode and point $P_1$, between the diode and point $P_2$, between point $P_2$ and the second vertical wall and between point $P_1$ and the first vertical wall are all substantially equal to one-sixth wavelength at frequency $f$.

17. The LSA oscillator circuit of claim 16 wherein:

the thickness of the iris is substantially equal to one-sixth wavelength at frequency $f$, whereby an oscillatory mode at frequency $3f$ is established within the iris.

18. In a circuit of the type comprising a bulk-effect semiconductor diode connector to a DC voltage source, a load resistance, and a parallel resonant circuit having a resonant frequency $f$, the parameters thereof being arranged to give oscillation in the device in the LSA mode at a frequency $f$, the improvement comprising;

means for adding a significantly high second harmonic component at frequency $2f$ to the voltage across the diode;

and means for adding a significantly high third harmonic component at frequency $3f$ to the current through the diode.

19. The improvement of claim 18 wherein:

the second harmonic adding means comprises a parallel resonant circuit having a resonant frequency $2f$;

and the third harmonic adding means comprises a series resonant circuit having a resonant frequency $3f$.

20. The improvement of claim 19 wherein:

the diode comprises a wafer of N-type gallium arsenide and is biased at a DC electric field of less than about 12 kilovolts per centimeter.